United States Patent [19]

Yu et al.

[11] Patent Number: 5,357,458
[45] Date of Patent: Oct. 18, 1994

[54] SYSTEM FOR ALLOWING A CONTENT ADDRESSABLE MEMORY TO OPERATE WITH MULTIPLE POWER VOLTAGE LEVELS

[75] Inventors: James Yu; Tiao-Hua Kuo, both of San Jose, Calif.

[73] Assignee: Advanced Micro Devices, Inc., Sunnyvale, Calif.

[21] Appl. No.: 83,736

[22] Filed: Jun. 25, 1993

[51] Int. Cl.$^5$ ............................................. G11C 15/00
[52] U.S. Cl. ................................ 365/49; 365/189.07; 365/226
[58] Field of Search ............... 365/189.07, 49, 226–228

[56] References Cited

U.S. PATENT DOCUMENTS

| 5,136,544 | 8/1992 | Rozman | 365/201 |
| 5,197,034 | 3/1993 | Fandrich | 365/227 |
| 5,265,052 | 11/1993 | D'Arrigo | 365/226 |
| 5,267,213 | 11/1993 | Sung | 365/226 |

Primary Examiner—Eugene R. LaRoche
Assistant Examiner—A. Zarabian
Attorney, Agent, or Firm—Benman Collins & Sawyer

[57] ABSTRACT

A system for allowing a content addressable memory (CAM) to operate with first and second power voltage levels including: a first input voltage for providing a first bias to the content addressable memory; a second input voltage for providing a second bias to the content addressable memory; and a selection device coupled to the first input voltage and the second input voltage for decoupling the first input voltage from the content addressable memory and coupling the second input voltage to the content addressable memory in response to coupling the second power voltage level to the content addressable memory. In a specific embodiment the system includes: a first power on reset coupled to the content addressable memory for initializing the content addressable memory when the first power voltage level is initially coupled to the content addressable memory; and a second power on reset coupled to the content addressable memory for initializing the content addressable memory when the second power voltage level is initially coupled to the content addressable memory. The system allows a CAM to operate at a power voltage level of 2.6 to 3.6 volts to reduce power dissipation and at a higher voltage during programming of an electrically programmable memory. The system provides multiple resets to a CAM for proper operation with multiple power supply levels. The system also provides a CAM that allows access to redundant addresses of an electrically programmable read only memory (EPROM) and that allows programming of the EPROM with traditional programming equipment.

18 Claims, 3 Drawing Sheets

SYSTEM FOR ALLOWING A CONTENT ADDRESSABLE MEMORY TO OPERATE WITH MULTIPLE POWER VOLTAGE LEVELS

BACKGROUND OF THE INVENTION

1. Field of the Invention

This invention relates to content addressable memory (CAM) to store the address location for the defective bit in memory redundancy scheme and more particularly to content addressable memories with multiple power voltage levels.

2. Description of the Related Art

A conventional content addressable memory (CAM) is composed of an array of stored words with each word in the array having an associated comparator. When a comparand data is presented to the CAM, a simultaneous compare operation is performed between the comparand and all the words in the array. If the comparand and a word in the CAM are matched, then a match signal is generated. A user can program a CAM by writing data into the array.

One application of a CAM is to provide for access to redundant addresses in an electrically programmable read only memory (EPROM). The CAM compares addresses for the EPROM to a set of addresses that are known to have manufacturing defects. If an address to the EPROM matches the contents of the CAM, then the address can be converted to a redundant row or column address for the spare elements of the EPROM, which provides redundancy for the EPROM as fault correction. The CAM and the EPROM can be fabricated together onto a single integrated circuit.

A conventional CAM operates from a single power supply voltage, which is typically a 5 volt $V_{cc}$ power supply. This invention is related to low voltage EPROM design, which the operating $V_{cc}$ is typically 3.3 v with a range from 2.6 v to 3.6.

If a CAM is fabricated on the same integrated circuit with an EPROM, then the CAM must operate properly when the EPROM on the integrated circuit is programmed with a conventional programmer. To program an EPROM using traditional programming equipment, a programming voltage $V_{pp}$ of about 12 volts is applied and the $V_{cc}$ power supply is raised to 6.25 volts. If a CAM normally operates at a $V_{cc}$ power supply level of 5 volts, then the CAM circuit $V_{cc}$ operation window can accommodate raising the voltage from 5 volts to 6.25 volts.

If a conventional CAM design is operated at a $V_{cc}$ power supply of 3.3 volts for the portable systems, without sacrificing power and speed, the CAM circuit $V_{cc}$ operation window does not have the range to accommodate raising the $V_{cc}$ power supply for the CAM from 3.3 volts to 6.25 volts, when the EPROM is programmed with a conventional programmer.

One approach to solve this problem would be to design the EPROM to be programmed at lower voltages; however, this approach would preclude the use of conventional EPROM programming equipment, which requires that high voltages be used for programming the EPROM. Changing the EPROM programming equipment to operate at a lower voltage would be expensive and would have required new process/device technology development.

A CAM must be reset or initialized to properly operate. For a conventional CAM operating at a $V_{cc}$ power supply of 5 volts, or a $V_{cc}$ power on reset is used to reset the CAM. The $V_{cc}$ power on reset does not alter the array of words stored in the CAM, but rather initializes the readout of the CAM to the proper state so that the CAM will operate properly.

A CAM operating at a low $V_{cc}$ power voltage of 3.3 volts does not function properly when programming the EPROM, because of the raised $V_{cc}$ power voltage level of 6.25 volts applied to the circuits is beyond the circuit $V_{cc}$ operation window of the CAM.

Accordingly, there is a need in the art for a system that allows a CAM to operate at a power voltage level of 2.6 to 3.6 volts to reduce power dissipation and at a higher voltage during programming of an electrically programmable memory. There is also a need for a system that resets a CAM for proper operation with multiple power supply levels. There is also a need for a system for CAM that provides access to redundant addresses of an electrically programmable read only memory (EPROM) and that allows programming of the EPROM with traditional programming equipment.

SUMMARY OF THE INVENTION

The need in the art is addressed by a system for allowing a content addressable memory (CAM) to operate with first and second power voltage levels. The invention includes a first input voltage for providing a first bias to the content addressable memory and a second input voltage for providing a second bias to the content addressable memory. A selection device, coupled to the first input voltage and the second input voltage decouples the first input voltage from the content addressable memory and couples the second input voltage to the content addressable memory in response to coupling the second power voltage level to the content addressable memory.

In a first aspect the system further includes a first power on reset coupled to the content addressable memory for initializing the content addressable memory when the first power voltage level is initially coupled to the content addressable memory. A second power on reset is also coupled to the content addressable memory for initializing the content addressable memory when the second power voltage level is initially coupled to the content addressable memory.

In another aspect the selection device further includes a first sensing device coupled to the selection device for detecting when the second power voltage level is coupled to the content addressable memory. The need in the art is also addressed by the improved programmable read only memory having redundant addresses and operable with first and second power voltage levels. The invention includes a content addressable memory for controlling access to the redundant addresses of the programmable read only memory. A first input voltage provides a first bias to the content addressable memory and a second input voltage provides a second bias to the content addressable memory. A selection device is coupled to the first input voltage and the second input voltage for decoupling the first input voltage from the content addressable memory and coupling the second input voltage to the content addressable memory in response to coupling the second power voltage level to the programmable read only memory. A first power on reset is coupled to the content addressable memory for initializing the content addressable memory when the first power voltage level is initially coupled to the content addressable memory and a second power on reset is coupled to the content addressable memory for initializing the content addressable memory when the second power voltage level is initially coupled to the programmable read only memory.

In a first aspect the improved programmable read only memory further includes a comparator for matching an address for accessing the programmable read only memory to contents of the content addressable memory. A conversion device is coupled to the comparator for mapping the addresses for access to the redundant addresses of the programmable read only memory.

The need in the art is also addressed by a system for allowing a content addressable memory (CAM) to operate with first and second power voltage levels that includes a first power on reset coupled to the content addressable memory for initializing the content addressable memory when the first power voltage level is initially coupled to the content addressable memory. A second power on reset is coupled to the content addressable memory for initializing the content addressable memory when the second power voltage level is initially coupled to the content addressable memory.

The system allows a CAM to operate at a power voltage level of 2.6 to 3.6 volts and at a higher voltage during programming of an electrically programmable memory. The system provides multiple resets to a CAM for proper operation with multiple power supply levels. The system also provides a CAM that allows access to redundant addresses of an electrically programmable read only memory (EPROM) and that allows programming of the EPROM with traditional programming equipment.

DESCRIPTION OF THE INVENTION

The present invention relates to an improvement in the operation of content addressable memories. The following description is presented to enable one of ordinary skill in the art to make an use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

The advantageous design and operation of the present invention and illustrative embodiments and exemplary applications will now be described with reference to the accompanying drawings.

Figure 1:
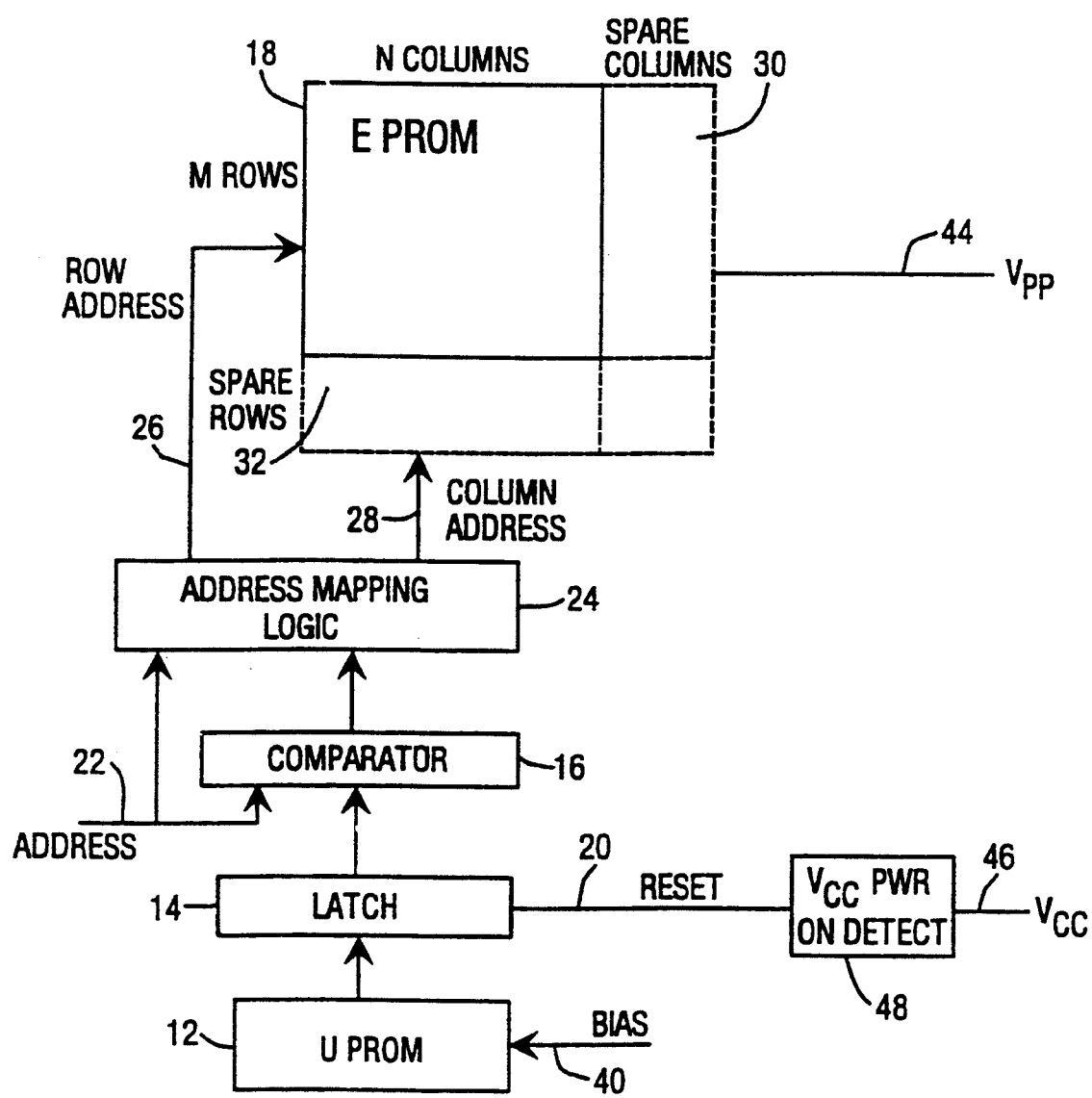
FIG. 1 is an illustrative block diagram showing a conventional CAM that provides access to redundant addresses of an EPROM to provide fault tolerance.

FIG. 1 is an illustrative block diagram showing a conventional CAM that provides access to redundant addresses of an electrically programmable read only memory (EPROM) 18 to provide fault tolerance. The EPROM, as shown in FIG. 1, has N columns and M rows and spare columns 30 and spare rows 32. The conventional CAM includes a programmable memory 12, a latch 14, and a comparator 16 and operates at a $V_{cc}$ power voltage level 46 of 5 volts. The programmable memory 12 is used to store addresses of the EPROM 18 that are known to have manufacturing defects. The contents of the programmable memory 12 are latched in latch 14 by reset pulse 20, when the $V_{cc}$ power is detected by $V_{cc}$ power on detect circuit 48. The $V_{cc}$ power on reset pulse 20 does not alter the words stored in the CAM, but rather initializes the latch 14 output to the state of programmable memory 12. If an address 22 to the EPROM 18 compares to the contents of the latch 14, then the address is converted by address mapping logic 24 to an address for a spare column 30 or spare row 32 of the EPROM 18. This provides redundancy for the EPROM.

Figure 2:
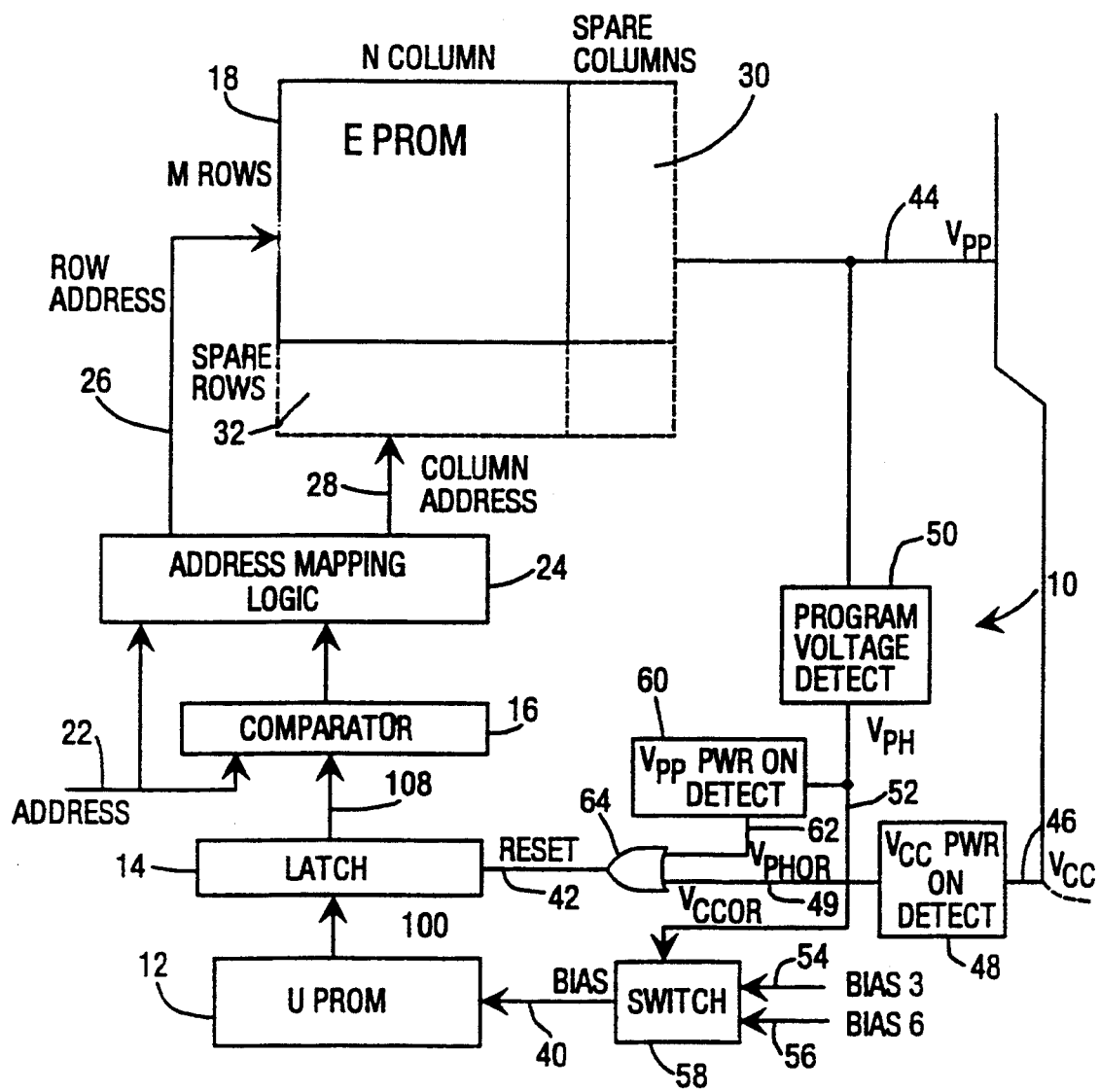
FIG. 2 is an illustrative block diagram showing a CAM that provides access to redundancy addresses of an EPROM to provide fault tolerance and allows operation of the CAM at a low voltage level and programming of the EPROM with conventional programming voltages according to the present invention.

FIG. 2 is an illustrative block diagram showing a CAM that provides access to redundancy addresses of an EPROM to provide fault tolerance and allows operation of the CAM at a low voltage level and programming of the EPROM with conventional programming voltages according to the present invention.

To properly operate in the system 10 shown in FIG. 2, the content addressable memory must be biased to operate at a both a low voltage level, which is applied to the content addressable memory when the EPROM is being read, and a high voltage level, which is required during the programming of the EPROM with traditional programming voltages. In particular the programmable memory 12 must be biased via bias input 40 to operate properly. The programmable memory 12 can be implemented as an unerasable programmable read only memory (UPROM). There are two operating bias modes for the UPROM 12 in the content addressable memory; the read mode and the programming mode.

During operation while reading the EPROM, the UPROM must be biased in a read mode by using a bias such as input voltage bias (bias3) 54, shown in FIG. 2. This bias allows the content addressable memory to operate in a low voltage of 2.6 to 3.6 volts.

If the CAM, including programmable memory 12, latch 14, and comparator 16, is fabricated on the same integrated circuit with the EPROM 18, then the CAM must also operate properly when the EPROM 18 is programmed in a programmer. To program the EPROM 18 using traditional programming equipment, a programming power voltage level $V_{pp}$) 44 of about 12 volts is applied to the EPROM 18. Also, during programming of the EPROM 18, the $V_{cc}$ power voltage level 46, which supplies power to the system 10 and the content addressable memory, is raised to 6.25 volts. For a conventional CAM operating at 5 volts, the circuit $V_{cc}$ operation window can accommodate raising the $V_{cc}$ power voltage level 46 from 5 volts to 6.25 volts, which is the reason that only a single bias is shown for the conventional CAM shown in FIG. 1. However, for the CAM of FIG. 2, which is designed to operate at a low $V_{cc}$ power voltage level 46 of about 3.3 volts to reduce power dissipation, the circuit $V_{cc}$ operation window does not have the range to accommodate raising the $V_{cc}$ power voltage level 46 for the CAM from 3.3 volts to 6.25 volts.

To allow operation of the CAM at a low voltage level of 2.6 to 3.6 volts and to allow programming of the EPROM with the traditional programming voltages, the present invention provides a second bias mode for the programming mode to the CAM circuit, which is second input voltage bias (bias6) 56.

The present invention, shown in FIG. 2, also provides a second reset to the latch 14. When the programming power voltage level ($V_{pp}$) 44 is raised to 12 volts, then the program voltage detect circuit 50 detects $V_{pp}$ and a program voltage detection signal ($V_{ph}$) 52 controls switch 58 to decouple the first input voltage bias (bias3) 54, which is the bias in the read mode, from the bias input 40, and selects a EPROM programming bias input to the CAM by coupling the second input voltage bias (bias6) 56, which is the bias in the programming mode, to the bias input 40.

The program voltage detection signal ($V_{ph}$) 52 is detected by $V_{pp}$ power on detect circuit 60, which sends a $V_{pp}$ power on reset pulse ($V_{phor}$) 62 via OR gate 64 to latch 14. The reset 42 sets the output of latch 14 to the contents of the programmable memory 12.

As in a conventional CAM, the latch 14 of the present invention, shown in FIG. 2, is also reset by $V_{cc}$ power on reset pulse 49 when the $V_{cc}$ power voltage level 46 is detected by $V_{cc}$ power on detect circuit 48. Resetting the latch on detection of either $V_{cc}$ power on or $V_{pp}$ power on, as shown in FIG. 2, ensures that the output of latch 14 is proper in both the read mode, which is the operating mode while the electrically programmable read only memory 18 is being read, and the programming mode, which is the mode while programming the EPROM. The latch 14 output must be in the proper state during the EPROM programming mode so that the spare rows 32 and spare columns 30 of the EPROM 18 are properly addressed while programming the EPROM.

The bias input 40 for the programmable memory 12 is switched to either the first input voltage bias (bias3) 54 for the read mode or the second input voltage bias (bias6) 56 for the EPROM programming mode. The second input voltage bias (bias6) 56 allows the CAM to operate properly when the programming power voltage level ($V_{pp}$) 44 is raised to 12 volts and the $V_{cc}$ power voltage level 46 is raised to 6.25 volts during programming of the EPROM.

Figure 3:
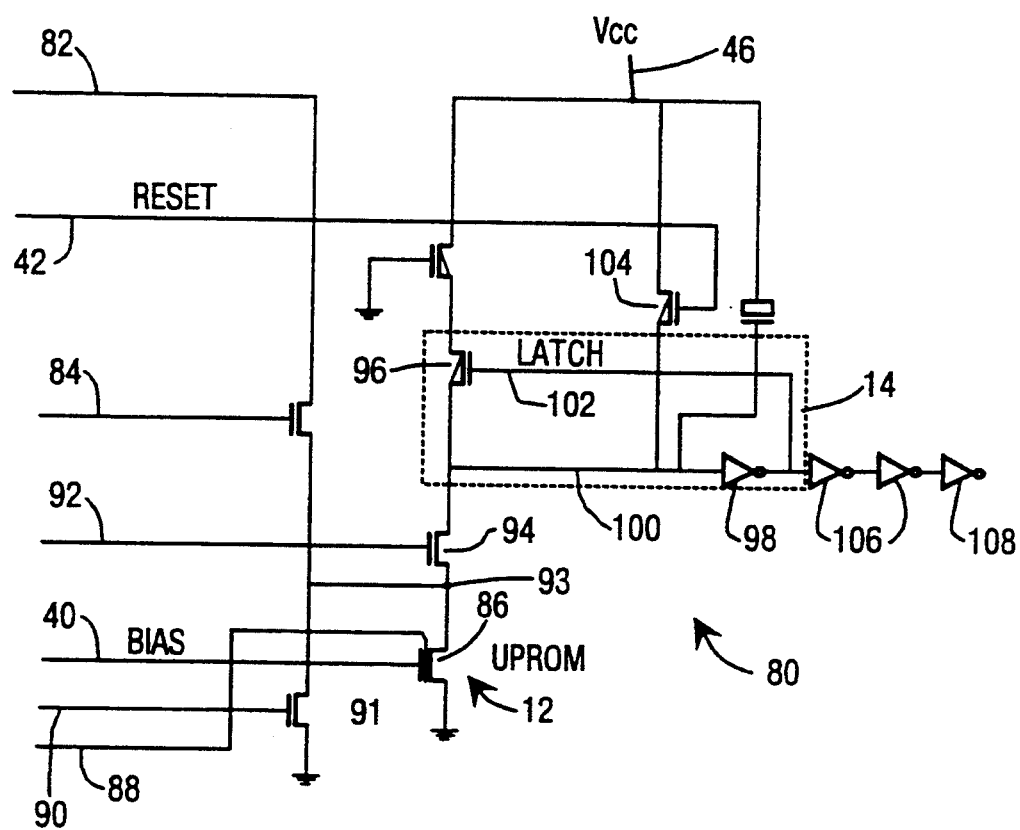
FIG. 3 is an illustrative diagram showing a portion of a CAM that can operate at a low voltage according to the present invention.

FIG. 3 is an illustrative diagram showing a portion of the CAM circuit of FIG. 2 that can operate at 2.6 to 3.6 volts and at a higher voltage according to the present invention. The programmable memory 12 is implemented by a floating gate transistor 86. To store failed EPROM addresses into the programmable memory 12, a voltage 82 is applied and a signal 84 is put in a high state and the UPROM 12 is programmed. After the UPROM is programmed then the signal 84 and 40 are put in a low state and the signal 90 is put in a high state to discharge the circuit node 93 and the signal input 92 is also changed to a bias that turns the transistor 94 ON.

When the $V_{cc}$ power on reset pulse 49 or the $V_{pp}$ power on reset pulse (Vphor) 62 are applied, the reset 42 is momentarily low. The reset 42 turns the transistor 104 ON, which sends the circuit node 100 to a high state. The feedback through the invertor 98 and the circuit node 102 to the transistor 96 latches the state of the circuit node 100 and implements the latch 14.

If a "0" is stored in the programmable memory 12, then the floating gate transistor 86 cannot conduct current and the circuit node 100 is kept in a high state. However, if a "1" is stored into the programmable memory 12, then the floating gate transistor 86 conducts current and discharges the circuit node 100, which puts node 100 in a low state. The low state is retained in latch 14, because circuit node 102 is sent to a high state, which turns the transistor 96 OFF. The output of the latch 14 is sent to the comparator 16 via invertors 106 and the latch output 108.

During the programming mode, the bias input 40 is switched as described above by switch 58 to second input voltage bias (bias6) 54.

The system allows a CAM to operate at a power voltage level of 2.6 to 3.6 volts to reduce power dissipation and at a higher voltage during programming of an electrically programmable memory. The system provides multiple resets to a CAM for proper operation with multiple power supply levels. The system also provides a CAM that allows access to redundant addresses of an electrically programmable read only memory (EPROM) and that allows programming of the EPROM with traditional programming equipment.

Thus, the present invention has been described herein with reference to a particular embodiment for a particular application. Nonetheless, those having ordinary skill in the art and access to present teachings will recognize additional modifications, applications, and embodiments within the scope thereof. For example, the power supply voltages of the present invention may be replaced by other power supply voltages without departing from the scope of the present invention.

It is therefore intended by the appended claims to cover any and all such applications, modifications and embodiments within the scope of the present invention.

What is claimed is:

1. A system for allowing a content addressable memory to operate with first and second power voltage levels comprising:
   means for providing a first bias voltage to the content addressable memory;
   means for providing a second bias voltage to the content addressable memory; and
   selection means coupled to the first bias voltage means and the second bias voltage means for decoupling the first bias voltage providing means from the content addressable memory and coupling the second bias voltage providing means to the content addressable memory in response to coupling the second power voltage level to the content addressable memory.

2. The system of claim 1 further comprising:
   first power on reset means coupled to the content addressable memory for initializing the content addressable memory when the first power voltage level is initially coupled to the content addressable memory; and
   second power on reset means coupled to the content addressable memory for initializing the content addressable memory when the second power voltage level is initially coupled to the content addressable memory.

3. The system of claim 2 wherein the selection means further comprises a first sensing means coupled to the selection means for detecting when the second power voltage level is coupled to the content addressable memory.

4. The system of claim 3 wherein the first power on reset means further comprises a second sensing means coupled to the content addressable memory for detecting when the first power voltage level is coupled to the content addressable memory.

5. The system of claim 4 wherein the second power on reset means further comprises a third sensing means coupled to the first sensing means for detecting when the first sensing means detects the second power voltage level coupled to the content addressable memory.

6. The system of claim 5 wherein the content addressable memory further comprises:
   a programmable memory having an input bias voltage coupled to the selection means and an output; and
   a latch coupled to the output of the programmable memory.

7. The system of claim 6 wherein the first power on reset means and the second power on reset means are coupled to the latch.

8. The system of claim 7 wherein the selection means couples either the first input voltage means or the second input voltage means to the input bias of the programmable memory.

9. The system of claim 7 wherein the second power voltage level is greater than 11 volts and wherein the first power voltage level is between 2.6 volts and 3.6 volts.

10. The system of claim 7 wherein the second power voltage level is greater than 6 volts and wherein the first power voltage level is between 2.6 volts and 3.6 volts.

11. An improved programmable read only memory having redundant addresses and operable with first and second power voltage levels comprising:
    content addressable memory means for controlling access to the redundant addresses of the programmable read only memory and for storing addresses of the programmable read only memory;
    first input voltage means for providing a first bias to the content addressable memory;
    second input voltage means for providing a second bias to the content addressable memory;
    selection means coupled to the first input voltage means and the second input voltage means for decoupling the first input voltage means from the content addressable memory and coupling the second input voltage means to the content addressable memory in response to coupling the second power voltage level to the programmable read only memory;
    first power on reset means coupled to the content addressable memory for initializing the content addressable memory when the first power voltage level is initially coupled to the content addressable memory; and
    second power on reset means coupled to the content addressable memory for initializing the content addressable memory when the second power voltage level is initially coupled to the programmable read only memory.

12. The improved programmable read only memory of claim 11 further comprising:
    comparator means coupled to the content addressable memory for matching an address for accessing the programmable read only memory to the addresses stored in the content addressable memory; and
    conversion means coupled to the comparator means for mapping the address for accessing the programmable read only memory to a respective redundant address of the programmable read only memory.

13. The improved programmable read only memory of claim 12 wherein the content addressable memory further comprises:
    a programmable memory having an input bias coupled to the selection means and an output; and
    a latch coupled to the output of the programmable memory and coupled to the comparator means.

14. The system of claim 13 wherein the first power on reset means and the second power on reset means are coupled to the latch.

15. The system of claim 14 wherein the selection means couples either the first input voltage means or the second input voltage means to the input bias of the programmable memory.

16. A system for allowing a content addressable memory to operate with first and second power voltage levels comprising:
    first power on reset means coupled to the content addressable memory for initializing the content addressable memory when the first power voltage level is initially coupled to the content addressable memory; and
    second power on reset means coupled to the content addressable memory for initializing the content addressable memory when the second power voltage level is initially coupled to the content addressable memory.

17. The system of claim 16 wherein the first power on reset means further comprises a first sensing means coupled to the content addressable memory for detecting when the first power voltage level is coupled to the content addressable memory.

18. The system of claim 17 wherein the second power on reset means further comprises a second sensing means coupled to the content addressable memory for detecting when the second power voltage level is coupled to the content addressable memory.

* * * * *